(12) United States Patent
Zhuang et al.

(10) Patent No.: US 7,001,780 B2
(45) Date of Patent: Feb. 21, 2006

(54) METHOD OF FABRICATION OF AN FERAM CAPACITOR AND AN FERAM CAPACITOR FORMED BY THE METHOD

(75) Inventors: Haoren Zhuang, Tokyo (JP); Ulrich Egger, Tokyo (JP); Jingyu Lian, Tokyo (JP); Stefan Gernhardt, Kanagawa-Ken (JP); Hiroyuki Kanaya, Kanagawa-Ken (JP)

(73) Assignees: Infineon Technologies AG, (DE); Kabushiki Kaisha Toshiba, (JP)

( * ) Notice: Subject to any disclaimer, the term of this patent is extended or adjusted under 35 U.S.C. 154(b) by 141 days.

(21) Appl. No.: 10/635,140

(22) Filed: Aug. 6, 2003

(65) Prior Publication Data

US 2005/0029563 A1 Feb. 10, 2005

(51) Int. Cl.
*H01L 21/00* (2006.01)
(52) U.S. Cl. .......................... 438/3; 438/239
(58) Field of Classification Search ................ 257/295, 257/296, 306
See application file for complete search history.

(56) References Cited

U.S. PATENT DOCUMENTS

| | | | |
|---|---|---|---|
| 5,972,722 A | | 10/1999 | Visokay |
| 6,538,272 B1 * | | 3/2003 | Yamazaki et al. .......... 257/295 |
| 6,555,431 B1 | | 4/2003 | Xing et al. |
| 6,600,185 B1 * | | 7/2003 | Tani et al. ................... 257/296 |
| 6,645,779 B1 * | | 11/2003 | Hong ............................. 438/3 |
| 6,781,177 B1 * | | 8/2004 | Kutsunai ..................... 257/295 |
| 6,831,323 B1 * | | 12/2004 | Ito et al. ...................... 257/306 |
| 2002/0075736 A1 | | 6/2002 | Kanaya et al. |
| 2002/0151162 A1 | | 10/2002 | Sanger et al. |
| 2003/0047771 A1 | | 3/2003 | Kweon et al. |

FOREIGN PATENT DOCUMENTS

EP 1 150 340 A 10/2001

OTHER PUBLICATIONS

International Search Report, mailing date Nov. 10, 2004.

* cited by examiner

*Primary Examiner*—Thao P. Le
(74) *Attorney, Agent, or Firm*—Lerner, David, Littenberg, Krumholz & Mentlik, LLP

(57) ABSTRACT

A ferroelectric device includes a bottom electrode on which are formed ferrocapacitor elements and, over the ferroelectric elements, top electrodes. The bottom electrodes are connected to lower layers of the device via conductive plugs, and the plugs and bottom electrodes are spaced apart by barrier elements of Ir and/or $IrO_2$. The barrier elements are narrower than the bottom electrode elements, and are formed by a separate etching process. This means that Ir fences are not formed during the etching of the bottom electrode. Also, little Ir and/or $IrO_2$ diffuses through the bottom electrode to the ferroelectric elements, and therefore there is little risk of damage to the ferroelectric material.

6 Claims, 4 Drawing Sheets

METHOD OF FABRICATION OF AN FERAM CAPACITOR AND AN FERAM CAPACITOR FORMED BY THE METHOD

FIELD OF THE INVENTION

The present invention relates to fabrication processes for ferroelectric devices which include one or more ferrocapacitors, and to ferroelectric devices produced by the fabrication processes.

BACKGROUND OF INVENTION

It is well known to produce FeRAM capacitors with a COP (capacitor on plug) structure. The capacitor is fabricated from a bottom electrode layer, a ferroelectric layer, and a top electrode layer. These layers are formed on a substructure having other electronic components in lower levels, and a plug of conductive material extends upwards from the other components, for electrical connection to the bottom electrode of the capacitor. Between the top of the plug and the bottom electrode layer are located one or more conductive barrier layers of $IrO_2$ and/or Ir (for example layers in the sequence $IrO_2/Ir/Ir$), for preventing diffusion of gases between the bottom electrode and the plug.

Hardmask elements, typically formed Tetraethyl Orthosilicate (TEOS), are deposited over the top electrode layer, and used to etch the structure so as to remove portions of the bottom electrode layer, ferroelectric layer, and top electrode layer which are not under the hardmask elements. The etching separates the top electrode layer into top electrodes, the bottom electrode layer into bottom electrodes, and the ferroelectric layer into ferroelectric elements sandwiched by respective pairs of top electrodes and bottom electrodes. This etching can be carried out in multiple stages, for example a first stage using a first set of hardmask elements in which the top electrode layer and ferroelectric layer are etched, and a second stage in which a second set of hardmask elements are deposited and used to etch the bottom electrode layer.

Two moments of this process are shown respectively in FIGS. 1(*a*) and 1(*b*). FIG. 1(*a*) shows a moment in which top electrode elements 1 (formed using first hardmask elements 2) and ferroelectric elements 3 (e.g. of PZT (lead zirconate titanate)), have been formed over a bottom electrode layer 5 of Pt. The bottom electrode layer 5 is itself formed over an $IrO_2$ layer 7, which is over an Ir/Ir layer 9 (the Ir/Ir layer 9 is in fact a stack of two separate layers). The Ir/Ir layer 9 covers a substructure having a TEOS matrix 11 through which plugs 13 of conductive material extend. The plugs 13 electrically connect the bottom electrode layers 5 (via the conductive barrier layers 7, 9) to further electronic elements (not shown) in lower levels of the structure. At the moment shown in FIG. 1(*a*), a TEOS layer 15 has just been deposited. Subsequently second hardmask elements 17 are formed over it, and as shown in FIG. 1(*b*) the structure is then etched to remove the portions of the bottom electrode layer 5 and barrier layers 7, 9 which are not beneath the second hardmask elements 17. Thus the bottom electrode layer 5 is divided into individual bottom electrode elements 19 which are connected by respective plugs 13 to respective sets of the further electronic elements (not shown). As shown in FIG. 1(*b*) there are two top electrode elements 1 and ferroelectric elements 3 per bottom electrode element 19, but this feature need not be present.

FIG. 1(*b*) illustrates two problems with this process. Firstly, the thick barrier layers 7, 9, when etched, form $Ir/IrO_2$ fences 21 on the sides of the ferrocapacitors. Secondly, damage 23 can occur to the ferroelectric elements 3 (especially at their sides), which reduces the parameter $Q_{sw}$ (the ferroelectric material capacitor charge difference between the polarization of the material when it is switched and without being switched). It is believed that this damage is caused by Ir and $IrO_2$ diffusing through the Pt bottom electrode layer 5 (e.g. during the processes which are performed to etch the top electrode layer and ferroelectric layer and/or the processes which are performed to etch the bottom electrode layer 5).

Recently, the article "4 Mbit embedded FRAM for high performance system on Chip (SoC) with large switching charge, reliable retention and high imprint resistance" by Y. Hofi, Y. Hikosaka, A. Itoh, K. Matuura, M. Kurasawa, G. Komuro, K. Muruyama, T. Enshita and S. Kashiwagi, published in the proceedings of IEDM 2002, appears to disclose a structure in which the Ir barrier element is recessed. However, in this case the barrier elements will be less able to prevent oxygen diffusion to the plug.

SUMMARY OF THE INVENTION

The present invention aims to provide a new and useful method for fabricating FeRAM devices, and new devices produced by the method.

In general terms, the invention proposes that a barrier layer is patterned to form individual barrier elements over respective plugs, that non-conductive support material is deposited to the sides of the barrier elements, that the bottom electrode layer is formed over the barrier elements and support material, and that the bottom electrode layer is patterned to form bottom electrode elements which are wider than the barrier elements. The sides of the barrier elements are covered by a support layer (which also supports the parts of the bottom electrode which do not overlie the barrier elements), and this support layer includes a material resistant to oxygen diffusion and to diffusion of the material which forms the barrier elements.

Since the barrier elements are narrower than the bottom electrode elements, the risk of formation of $Ir/IrO_2$ fences during the etching of the bottom electrode layer is much reduced. (Note that this is achieved in the invention without sacrificing the oxygen-blocking function, because the support layer performs part of this function).

Furthermore, since the barrier elements are narrower than the bottom electrodes, and due to the material in the support layer which blocks the diffusion of the barrier material, the barrier material (e.g. Ir/Ir or $IrO_2$) can only diffuse through the portion of the bottom electrode layer which lies directly over the barrier elements. This means that the total amount of Ir/Ir which diffuses through the bottom electrode layer is much reduced. In particular, it is much less likely to reach any of the ferroelectric material which is not directly over the barrier elements.

The material in the support layer which is resistant to diffusion of oxygen, Ir and/or $IrO_2$, may be a nitride, such as HCD nitride (HCD SiN, where HCD is an abbreviation for hexachlorodisilane), although other types of SiN or $Al_2O_3$ would also be suitable.

Optionally, the support layer may comprise, in addition to the Ir-and/or-$IrO_2$ diffusion resistant material, at least one layer of a structural material onto which the bottom electrode layer may be easily deposited, such as TEOS.

For example, the Ir-and/or-$IrO_2$ diffusion resistant material may be formed at the sides of the barrier elements, and also as a film extending between the barrier elements at a height below the top of the barrier elements, and the structural material may be formed to overlie the film of Ir-and/or-IrO$_2$ diffusion resistant material between the barrier elements.

Specifically, in a first aspect the invention provides a method of forming a ferrocapacitor device as part of a FeRAM device fabrication process, the method comprising the steps of;

forming barrier elements over a substructure, the barrier elements being in electrical contact with conductive elements extending into the substructure;

forming a support layer on the sides of the barrier elements, the support layer including a material resistant to diffusion of oxygen; and forming a ferrocapacitor over each barrier element and a neighboring portion of the support layer, the ferrocapacitor device including a bottom electrode element, at least one ferroelectric element formed over the bottom electrode element, and at least one top electrode element formed over the ferroelectric element.

In a second aspect, the invention provides an FERAM device including one or more ferrocapacitor devices, each ferrocapacitor device including a bottom electrode element, at least one ferroelectric element formed over the bottom electrode element, a top electrode element formed over the or each ferroelectric element, the bottom electrode element being formed over a barrier element having a smaller width than the bottom electrode element and over a support layer including a material resistant to diffusion of oxygen.

BRIEF DESCRIPTION OF THE FIGURES

Preferred features of the invention will now be described, for the sake of illustration only, with reference to the following figures in which.

DETAILED DESCRIPTION OF THE EMBODIMENTS

Figure 1A:
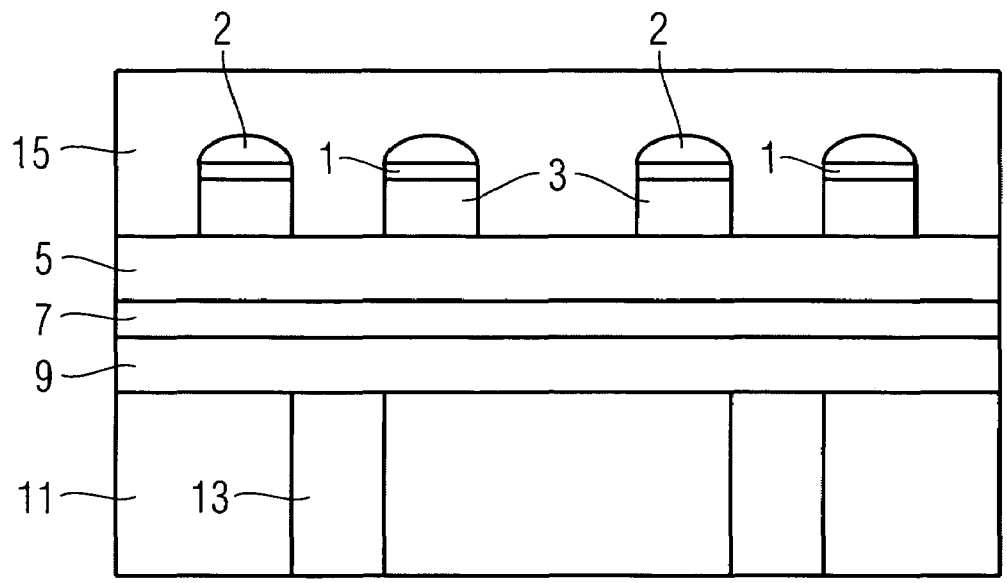
FIG. 1, which is composed of FIGS. 1(a) and 1(b), shows two moments during a known FeRAM fabrication process.
Figure 1B:
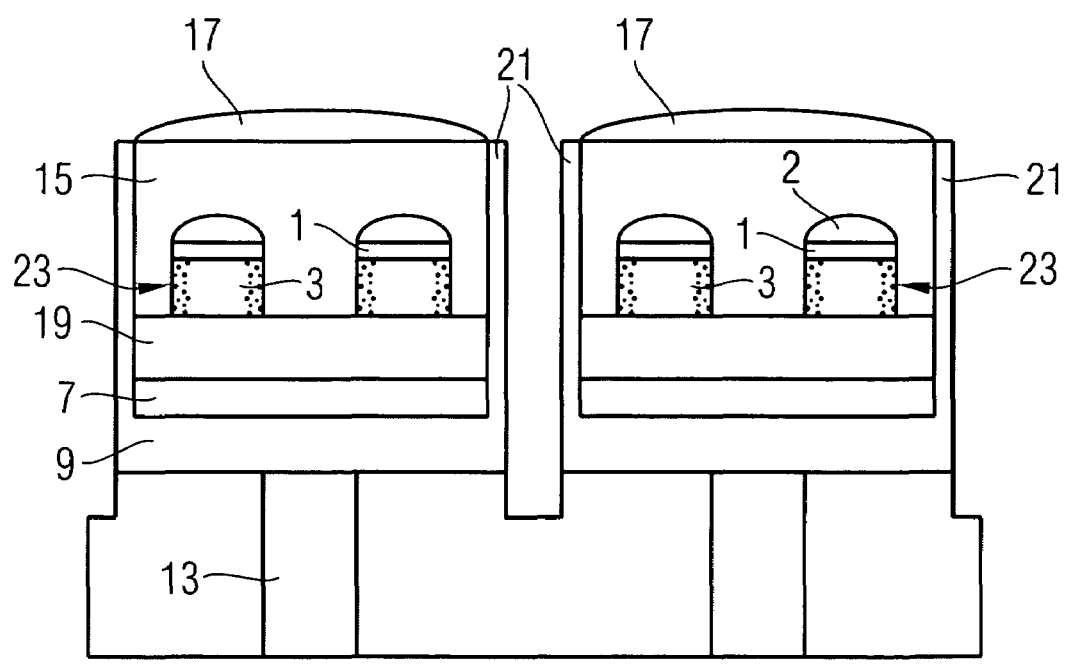
Figure 2A:
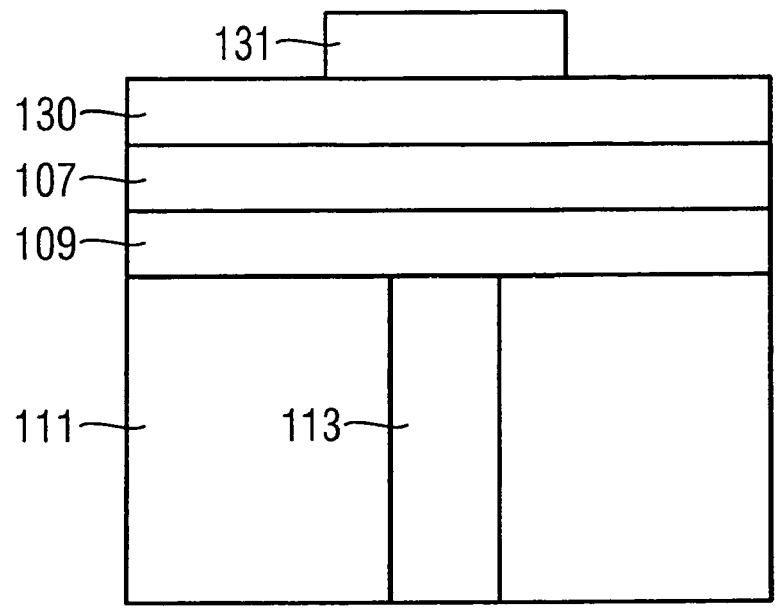
FIG. 2, which is composed of FIGS. 2(a) to 2(f), shows steps of an FeRAM fabrication process which is an embodiment of the invention.

Referring to FIG. 2(a), cross-sectional views are shown of steps in the fabrication of an FeRAM device. In particular the steps of forming a ferrocapacitor device in this FeRAM device are shown. Elements of FIG. 2 corresponding to those of FIG. 1 are shown by reference numerals 100 higher. Although the construction of only a single ferrocapacitor is shown, it is to be understood that normally a plurality of ferrocapactitors are formed laterally spaced from each other. In other words, at all stages shown in FIG. 2(a) to 2(f), the device should be envisaged as extending to either side of the figure, with a periodicity equal to the width of the figure.

The ferrocapacitor of FIG. 2 is formed over a substructure which may contain additional electronic components (e.g. other ferrocapacitors) which are not shown in FIG. 2. In FIG. 2(a), the upper part of the substructure is shown as 111, which is nonconductive matrix material (e.g. TEOS), through which a conductive plug 113 extends. The plug 113 is in electrical contact with one or more electrical components of the substructure (not shown).

Above the layer 111, and in particular over the plug 113, are formed in order an Ir/Ir layer 109, and an IrO$_2$ layer 107. The thicknesses of these barrier layers are as in conventional devices described above. Over the layer 107 is formed a layer 130 of a material such as TEOS, which is thick enough to act as a mask for subsequent etching the layers 107, 109 (the exact thickness depends on the etching conditions, but is typically 50 to 3000 nm). Over the layer 107 is formed an element 131 of resist material, having a centre substantially above the centre of the plug 113 (although it is wider than that plug). The element 131 is wider than the plug 113 and completely cover it. It may be square, round or even rectangular.

Figure 2B:
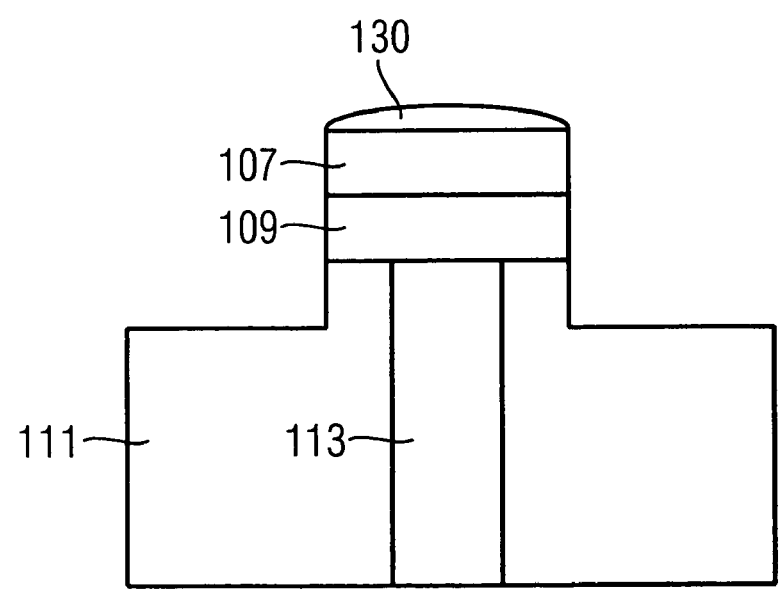

As shown in FIG. 2(b), the element 131 is used as a mask for RIE (reactive ion etching) etching of the layer 130, and is then removed by ashing. Then, the mask 130 is used to etch layers 107, 109. In this process the layer 130 is partly removed, and the layers 107, 109 are "squared off" to give barrier elements.

Figure 2C:
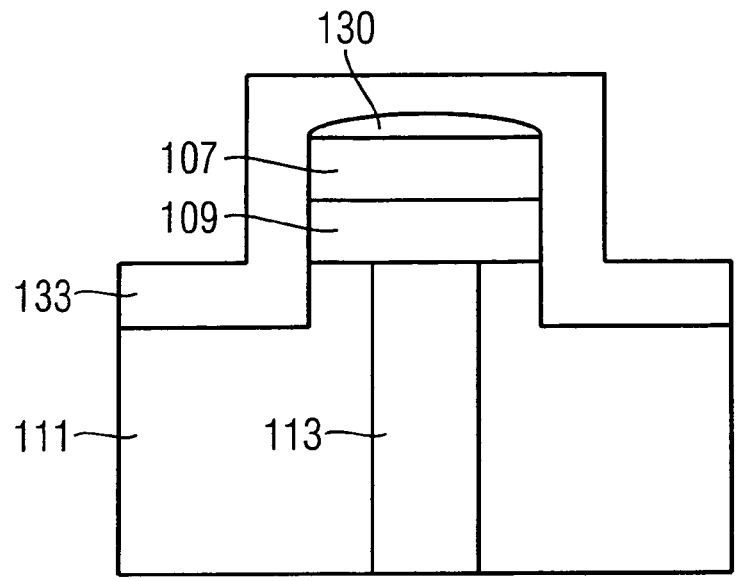

As shown in FIG. 2(c), a layer 133 of nitride material is now formed. The nitride material 113 overlies the upper surface of the TEOS matrix 111 and the TEOS element 130, and also covers the sides of the barrier elements 107, 109.

Figure 2D:
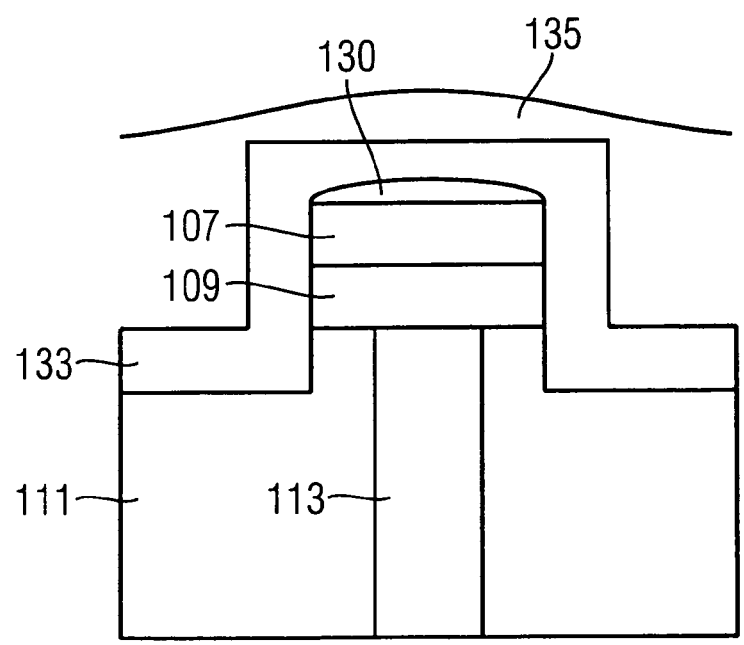

As shown in FIG. 2(d), another layer 135 of matrix material (again, TEOS, for example) is formed over the structure by deposition (e.g. CVD, chemical vapour deposition). This tends to have a peak over the raised barrier elements 107, 109.

As shown in FIG. 2(d), the upper surface of the layer 135 is removed by polishing (e.g. CMP, chemical mechanical planarization) to give a flat surface 137 partly made up of the upper surface of the layer 135 and partly of the upper surface of the barrier element 107. That is, the upper surface of the layer 135 is flush with the upper surface of the barrier element 107.

The process of fabricating a ferrocapactitor device can now be carried out exactly as in the prior art methods, with the upper surface 137 taking the place of the upper surface of the barrier layer 7 in FIG. 1. To begin with, there is a step of forming a bottom electrode layer (e.g. of Pt) over the upper surface 137. Since most of the upper surface 137 is TEOS, the Pt will have a good adhesion to the surface 137.

Then a ferroelectric layer and a top electrode layer are, formed over the bottom electrode layer. The top electrode layer and ferroelectric layer are then etched using first hardmask elements 102 (e.g. of TEOS) to form from them respectively top electrode elements 101 and ferroelectric elements 103. The ferroelectric elements 103 are substantially not directly above the barrier elements 107, 109. A matrix layer 115 (e.g. of TEOS) is then formed, including the ferroelectric elements 103, top electrode elements 101 and first hard mask elements 102. Second hardmask elements 117 are then formed on the matrix layer 115, and used to etch the matrix layer 115 and the bottom electrode layer. The bottom electrode layer is thus divided into bottom electrode elements 119. As in FIG. 1(b), the bottom electrode element 119 associated with two of the ferroelectric elements 113 and top electrodes 102.

Figure 2E:
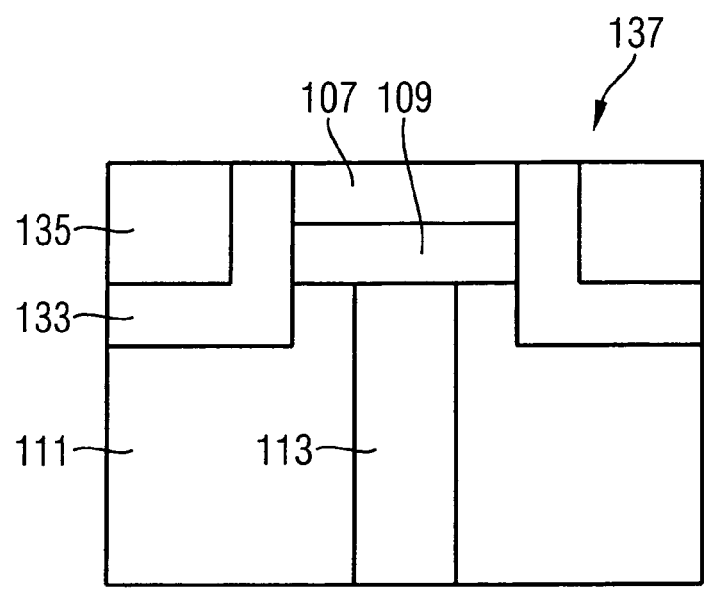
Figure 2F:
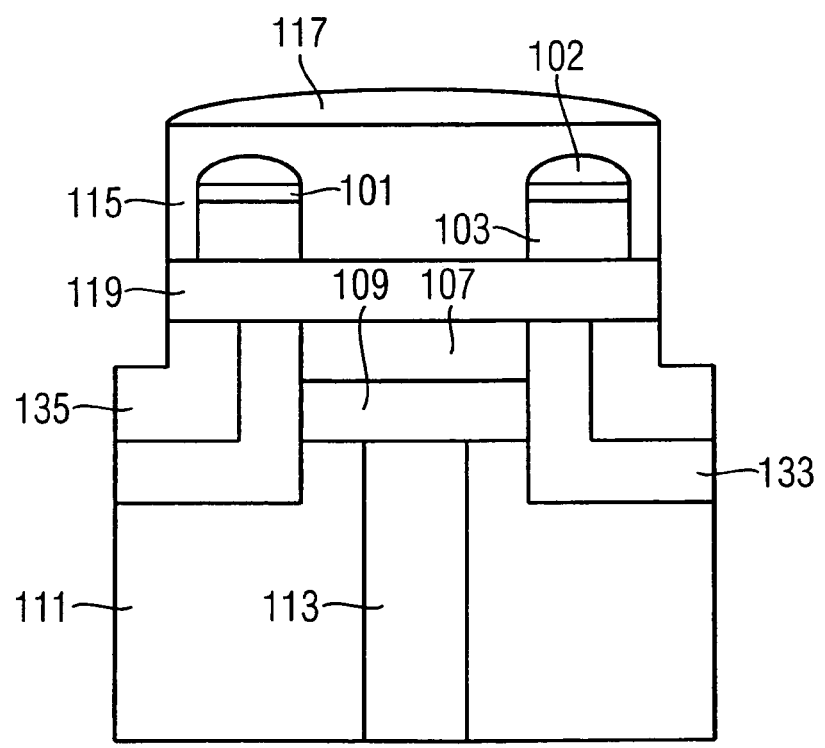

During the steps which are performed between FIGS. 2(e) and 2(f), only very limited diffusion of the IrO$_2$ and/or Ir can occur. This is partly because only a small portion of the bottom electrode element 119 is in contact with the barrier element 107 (and thus the area through which diffusion may occur is limited). Also, the nitride material 133 substantially prevents Ir and/or IrO$_2$ from diffusing through it. Thus, the fences 21 of FIG. 1(b) are not formed, and the ferroelectric elements 103 are exposed to much less Ir and/or IrO$_2$ than in the, conventional process shown in FIG. 1. This means that the ferroelectric elements 103 are damaged to a much lesser extent (hardly at all).

Note that if only the SiN 133 were used, without the TEOS 135, there would be a higher risk of "plug peeling" (i.e. peeling due to poor adhesion between the Pt and/or Ir and the SiN), whereas if the TEOS 135 were used without the SiN 133 then oxygen could penetrate through the TEOS 135, resulting in plug oxidation.

As in conventional devices, further process steps are now carried out to complete the FeRAM device. For example, conventionally conductive elements (plugs) are formed extending vertically through the hardmask elements 117, matrix 115 and hardmask elements 102, to connect the top electrodes 101 to other elements of the FeRAM device, e.g. components higher in the devices which are formed after the steps illustrated in FIG. 2. It will be evident to a skilled reader how all of these steps can be carried out, since they are identical to the steps of known methods.

Although only a single embodiment of the invention has been described in detail, many variations are possible within the scope of the invention as will be clear to a skilled reader.

We claim:

1. A method of forming a ferrocapacitor device as part of a FeRAM device fabrication process, said method comprising:

forming barrier elements over and in direct contact with a plug that is located within and extends into a substructure, at least one of the barrier elements being formed of Ir or $IrO_2$, the barrier elements being in electrical contact with the plug;

forming a support layer that surrounds the sides of the barrier elements, the support layer including HCD nitride to be resistant to diffusion of oxygen and resistant to diffusion of at least one of Ir and $IrO_2$; and forming a ferrocapacitor over the barrier elements and over an adjoining portion of the support layer, the ferrocapacitor device including a bottom electrode element, at least one ferroelectric element formed over the bottom electrode element, and at least one top electrode element formed over the ferroelectric element.

2. A method according to claim 1, wherein the lateral extent of the bottom electrode elements is at least twice the lateral extent of the barrier elements in at least one direction.

3. A method according to claim 1, wherein the barrier elements are each formed by depositing an Ir or $IrO_2$ layer and etching the Ir or $IrO_2$ layer to form individual barrier elements, the barrier elements being formed before the formation of the bottom electrode elements.

4. A method according to claim 1, wherein the support layer further includes an upper portion comprising a material for improving adhesion of the bottom electrode layer to the support layer.

5. A method according to claim 4, wherein the material for improving adhesion of the bottom electrode layer to the support layer is TEOS.

6. A method according to claim 1, wherein the support layer extends between the barrier elements.

\* \* \* \* \*

UNITED STATES PATENT AND TRADEMARK OFFICE
CERTIFICATE OF CORRECTION

PATENT NO. : 7,001,780 B2 Page 1 of 1
APPLICATION NO. : 10/635140
DATED : February 21, 2006
INVENTOR(S) : Haoren Zhuang et al.

It is certified that error appears in the above-identified patent and that said Letters Patent is hereby corrected as shown below:

Column 3, line 60, "nonconductive" should read --non-conductive--.
Column 4, line 40, "are," should read --are--.
Column 4, line 65, "the," should read --the--.

Signed and Sealed this

Eleventh Day of July, 2006

JON W. DUDAS
*Director of the United States Patent and Trademark Office*